United States Patent [19]

Hyatt et al.

[11] Patent Number: 5,020,964
[45] Date of Patent: Jun. 4, 1991

[54] METHOD AND APPARATUS FOR ROBOTIC TRANSFER OF WORKPIECES

[75] Inventors: Robert J. Hyatt, Stanford, Calif.; Edward H. Abbott, Ann Arbor, Mich.; Robert E. Bush, Rochester Hills, Mich.; Francis J. Shannon, Northville, Mich.

[73] Assignee: Ford Motor Company, Dearborn, Mich.

[21] Appl. No.: 441,854

[22] Filed: Nov. 27, 1989

[51] Int. Cl.$^5$ .................................. B25J 17/02
[52] U.S. Cl. ........................ 414/751; 901/16; 901/28; 294/65.5; 294/86.4; 403/DIG. 1; 414/786
[58] Field of Search ........ 414/729, 735, 749, 751–753, 414/786; 901/29, 28, 16; 294/65.5, 64.3, 86.4; 403/DIG. 1, 11, 15

[56] References Cited

U.S. PATENT DOCUMENTS

| 4,098,001 | 7/1978 | Watson | 33/169 C |
|---|---|---|---|
| 4,179,783 | 12/1979 | Inoyama et al. | 901/46 X |
| 4,337,579 | 7/1982 | DeFazio | 33/169 C |
| 4,439,926 | 4/1984 | Whitney et al. | 33/185 R |
| 4,595,334 | 6/1986 | Sharon | 414/735 |
| 4,609,325 | 9/1986 | Gabrielli | 403/DIG. 1 X |
| 4,661,037 | 4/1987 | Sugino et al. | 414/729 |
| 4,702,667 | 10/1987 | Hounsfield | 901/49 |

FOREIGN PATENT DOCUMENTS

| 1504027 | 10/1966 | France . |
|---|---|---|
| 2445199 | 8/1980 | France . |
| 2506195 | 5/1981 | France . |
| 872250 | 10/1981 | U.S.S.R. . |
| 872256 | 10/1981 | U.S.S.R. . |

Primary Examiner—Robert J. Spar
Assistant Examiner—Donald W. Underwood
Attorney, Agent, or Firm—Joseph W. Malleck; Roger L. May

[57] ABSTRACT

A robotic apparatus for positioning a tool or work hand that incorporates a compliant wrist effective to adjust to delicate but misaligned portions of the workpiece, comprising (a) structure for magnetically supporting a positioning member carrying a gripper tool; (b) pneumatic structure for selectively separating and floating the positioning member from said supporting structure to permit lateral adjustment of the positioning member in response to small forces received from the gripper tool as it carries out gripping; and (c) structure for locking the positioning member to the supporting structure upon completion of the desired lateral adjustment. A method of using such compliant wrist concept, comprising (a) magnetically suspending a positioning plate from a magnet, the plate carrying the gripper tool; (b) injecting a film of air between the interface of the magnet and plate to provide floating separation therebetween enabling ease of lateral movement; (c) closing a gripper tool about the part to be gripped causing any offcenter gripping forces to be translated back to the plate resulting in lateral movement in response thereto for seeking a centering position; and (d) upon achieving the desired centering position, deactivating the air injection to permit the magnet to lock the plate in position relative to the magnet for further robotic movement.

21 Claims, 11 Drawing Sheets

METHOD AND APPARATUS FOR ROBOTIC TRANSFER OF WORKPIECES

BACKGROUND OF THE INVENTION

1. Technical Field

This invention relates to the art of robotically moving objects between precise stations, and more particularly to compliance devices to accommodate misalignment in position or misalignment between portions of the workpiece prior to carrying out such movement or transfer.

2. Description of the Prior Art

Automatic mechanical assembly of precision fitting parts requires a method to accurately locate the parts relative to each other so meeting or interfit takes place without interference or contact. One example is the insertion of electronic elements, having ceramic, plastic or dipped portions provided with fragile wire leads extending therefrom, into mating, close-fitting lead receptacles. Although the elements can be stationed in an accurate spatial position by planting the leads in a fixture, the ability to pick up such elements depends upon gripping directly the ceramic portion thereof, which portion is cast, dipped or molded, and does not have the same tolerance of shape and definition that the wire leads have. Therefore, there can be a significant variation or misalignment between the wire leads and the ceramic body of the elements inhibiting accurate transfer or movement of such elements. If the robotic gripping tool were to force the element to adapt to its own preprogrammed positioning, the forces applied to the element would cause breakage or distortion, particularly at the leads.

The prior art has used compliant devices, slave plugs, and vision sensors to solve related problems. Compliant devices require lead-in edges on the receiving opening to permit offcenter mating of the workpiece and receptacle; the compliant device responds to sizable side thrust of the misaligned workpiece to provide centering. The requirement for lead-in edges frustrates the design of the control unit and must be carried out at slow speeds to avoid damage to the parts during offcenter mating. But, most significantly, such technique cannot be used with fragile parts such as electronic components. Some compliance devices use flexible or deformable material, captured between two metallic plates. The flexible material will deform to provide compliance. Compliance devices of this type are severely limited in that they do not provide the amount of compliance needed in many applications require relatively large side loads and are subject to fatigue failure problems. Many compliance devices use springs or hydraulic mechanisms to allow for some degree of flexibility in an angular or lateral direction (see U.S. Pat. Nos. 4,098,001; 4,439,926; 4,179,783; and French No. 2,445,199). The difficulty associated with these structures is that each structure uses an elastic mechanism to connect the major parts of the mechanism. These elastic devices are in permanent contact with such members, thus requiring relatively large side loads to affect compliance. Additionally, each device uses a rigid bearing member, such as ball bearings, to reduce the friction of movement. These rigid members add to side loading even though they roll or slip. Bearings and other sliding materials are subject to wear, thus adding to side loading. Moreover, these spring or flexure-based systems acquire hysteresis losses over time.

Slave plugs necessitate extra strokes of the assembly due to the need to stroke the parts together using the slave plug for alignment and again when the actual workpiece is inserted into a receptacle. Due to the possible contact between the slave plug and the part, the speed of such assembly method must be undesirably slow to avoid damage.

Vision or laser sensors often use search routines that comprise trial and error to find the correct alignment; the insertion carriage travels to where it believes the opening resides according to a hunt routine. This is not only time consuming, expensive and complicated, but also is not reliable in precisely locating the opening for precise, noncontact alignment. Vision systems often require markings (such as fiducials) or other preparations on the workpiece so that the robot may properly identify the workpiece or the workpiece's location and orientation.

Robot wrists are known which incorporate bearings between surfaces to allow a male part to be readily introduced into a bore when the end of the part and/or the opening of the bore are chamfered; free movement of the end piece with respect to the robot arm provides self-centering of the end piece but at the expense of complexity. Such robots are described more fully in U.S. Pat. Nos. 4,337,579; 4,595,334; 4,661,037; and French patent No. 2,506,195. Magnets have been introduced to such compliant devices with little success.

Two Russian patents use arcuate bearing joints, in one case by hydraulic drive means and in the other by an electromagnetic drive to achieve flexibility (see Russian patents SU-872-250 and SK-872-256); these devices are not responsive to microforces received from the workpiece to be compliant. In French patent No. 1,504,027, a magnetic member formed by two radially magnetized concentric rings separated by an air gap and, on the other hand, a part to be centered, which is made from a plastic material and in which are embedded metal bars or balls. Glass balls may be substituted to reduce friction and facilitate centering. For practical reasons, this magnetic device cannot be used in known robot wrists. These devices also do not provide for fixing or locking the position of a held part after it is retrieved.

Another disclosure, U.S. Pat. 4,609,325, provides a robot wrist having a connector with two elements magnetized in the direction of their axes and which are interposed between the robot arm and the end piece; they are disposed to attract each other mutually while being separated from each other by magnetized balls. When the workpiece provides a lateral force on the end piece, the wrist complies via the freedom of movement in the magnetic balls, but the force threshold is somewhat high; in the absence of a lateral force, the balls center by dividing themselves homogeneously between the two magnetized faces. The difficulty with this disclosure is that it does not provide an ultralow friction bearing, limiting its usefulness, and there is no locking means to ensure fixed positioning relative to the axis of the part.

It is therefore an object of this invention to provide a method and apparatus for precisely transferring or locating fragile and close-fitting parts, there being variable alignment between the portion of the part gripped and the portion of the part received in a receptacle.

SUMMARY OF THE INVENTION

The invention is a robotic apparatus for positioning a tool or work hand that incorporates a compliant wrist effective to adjust to delicate but misaligned portions of the workpiece while imparting only but the smallest microforces to the workpiece. The compliant wrist comprises (a) means for magnetically supporting a positioning member carrying a gripper tool; (b) pneumatic means for selectively separating and floating the positioning member from said supporting means to permit lateral and rotational adjustment of the positioning member in response to ultrasmall forces received from the gripper tool as it carries out gripping; and (c) means for locking the positioning member to the supporting means upon completion of the desired lateral adjustment.

Preferably, means (a) is a permanent magnet fixed to a nonmagnetic housing having a magnetic force sufficient to effectively suspend a freely movable magnetizable plate connected to the gripper tool. Preferably, means (b) is one or more air passages, extending through the magnet housing and/or magnet, and are positioned to spread a uniformly thin airflow between the plate and magnet, exiting at the edges of the plate, and causing the plate to be dependently suspended. The force of the magnet is equal and opposite to the force of the air pressure acting upon the surface of the floating member as well as the weight of the floating member and workpiece. Preferably, means (c) is a control for deactivating the pneumatic separating means, allowing the plate to be held against the magnet or against a shim fixed to the magnet to facilitate lift-off upon subsequent use of the repositioning mode.

Advantageous parameters useful in constructing the compliant wrist comprise: (i) a magnet having a force sufficient to be greater than the sum of the air pressure and the weight of the floating member and workpiece, and may be preferably obtained by use of a rare earth magnet, sometimes a thin nonmagnetic member to facilitate lift-off from the magnet, sometimes a plenum or airflow area between the magnet and plate which has an area sufficient to hold the weight and size of the workpiece, and a thickness sufficient to provide stability to the floating member, and sometimes a nonmagnetic material in the magnet to promote ease of fabrication; (ii) the pneumatic means comprises a composite throat area or orifice diameter for the lead-in passages with a cross-sectional area of about 0.012 inch$^2$ with a depth of about 0.01 inches and a diameter of about 0.625 inches and air pressure of 20–90 psi; and (iii) a plate comprised of a magnetically attractive material of strict flatness and smoothness.

Preferably, the compliant wrist may additionally comprise recentering means in the form of an electromagnetic or mechanical means for selectively applying a force along the float plane to automatically return the positioning member to a predetermined starting position after gripping and transfer is completed. If such means is electromagnetic, it may comprise attractive or repelling electromagnetic forces to achieve such purposes. If such means is alternatively mechanical, it may preferably deploy actuatable detents to realign such supporting member, with the detent having an actuatable axis either parallel or perpendicular to the float plane. In any case, the mechanical recentering means does not maintain continuous contact or coupling between the stationary and floating member.

The invention also comprehends a method of using such a compliant wrist concept comprising: (a) magnetically suspending a positioning plate from a magnet, the plate carrying the gripper tool; (b) injecting a film of air between the interface of the magnet and plate to provide floating separation therebetween enabling ease of lateral movement; and (c) closing a gripper tool about the part to be gripped causing any offcenter gripping forces to be translated back to the plate resulting in lateral movement in response thereto for seeking a centering position; and (d) upon achieving the desired centering position, deactivating the air injection to permit the magnet to lock the plate in position relative to the magnet. Preferably, the magnet is carried in a nonmagnetic housing for robotic movement to an overlaying position within a predetermined tolerance of the workpiece to be gripped.

DETAILED DESCRIPTION AND BEST MODE

Robots are utilized in various operations in industry, a major one being material handling where a given workpiece is taken from one storage area to a conveyor line, or machining area, or assembly station. When used in the machine handling mode, it is often common to present the workpieces to the robot in a stacked or aligned tray condition, that means the workpieces are fixtured and referenced to a known location. The robot must pick up the workpiece from the tray station and then transport the workpiece to a given area for assembly or machining. The workpiece can often have the grippable portion slightly warped or presented to the robot in a slightly mispositioned manner. The above-described conditions are often present when using a robot to retrieve, move and then precisely insert leaded electronic components. Since the travel pattern of the robot is fixed, the position of the grippable part of the workpiece must be known or compensated for. Misalignment between the robotically held tool and the insertable part of the workpiece will cause failure in the operation or damage to the workpiece.

Figure 1:
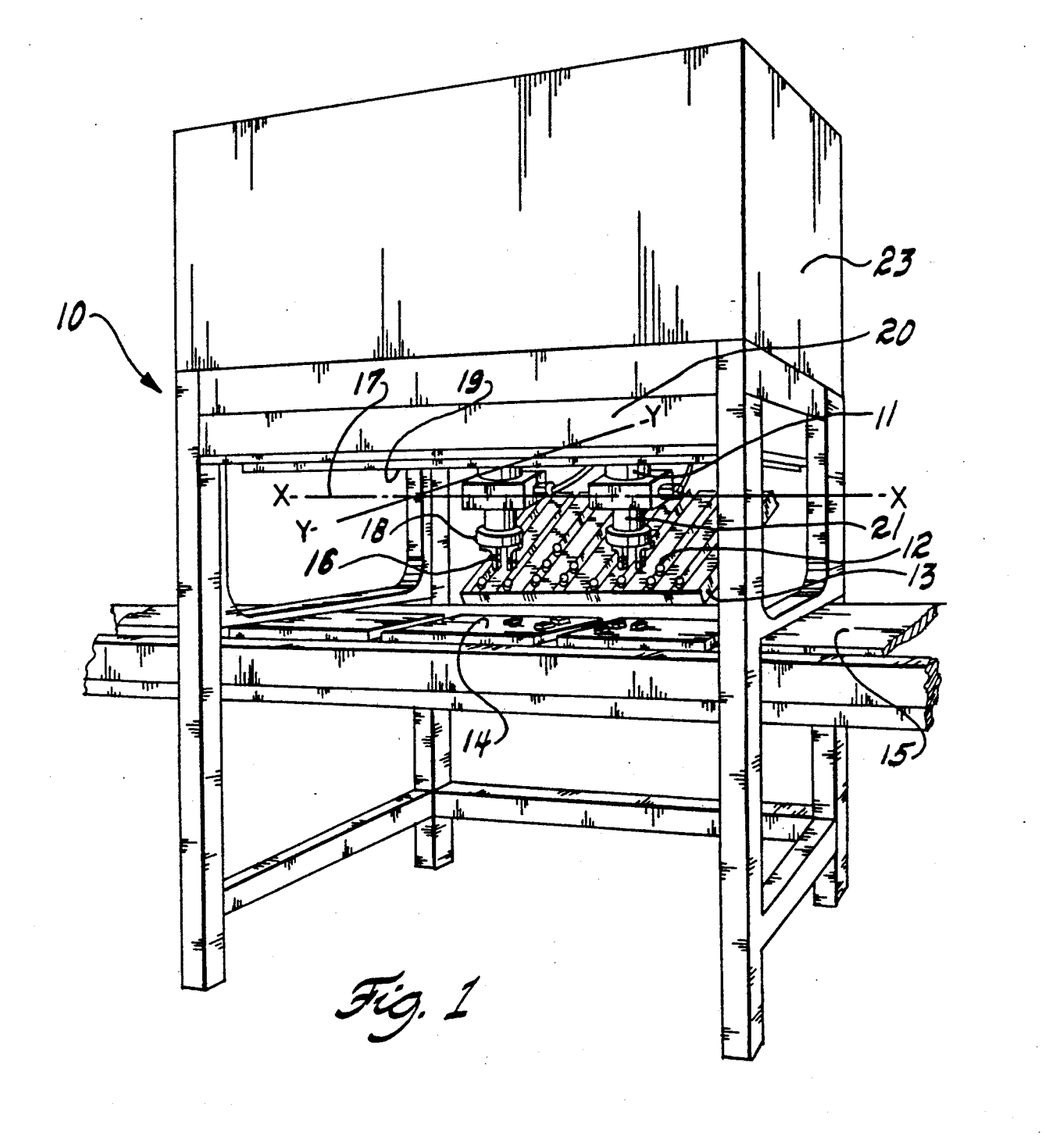
FIG. 1 is a perspective view of a linear motor robotic apparatus employing the compliant wrist and combination apparatus of this invention for installing electronic components in circuit boards.

The compliant float wrist is particularly suited to be used with SCAZA type robots which utilize a single arm rotatable in a horizontal plane and are most used in industry at this time. The compliant wrist can also be used with PUMA type robots and with linear motor robots. As shown in FIG. 1, the automated production apparatus 10 of this invention is adapted for a linear motor robot and provides for assembly of automotive electronics. Robot 11 picks up sometimes imperfectly shaped circuit components 12 from source pallets 13 and places each onto target circuit boards 14 being moved and indexed along a conveyor line 15. The circuit components are fixtured by their leads in precise holes at a known location; such holes make the leads inaccessible for gripping. The hand or tool 16 of the robot is translated within an X-Y plane 17 to locate over a component 12 based upon the position of the leads of the component. The tool or hand 16 is supported on a compliant wrist 18 which, in turn, is supported by a robot element moveable about bed 19 positioned over the conveyor 15, pallets 13, and circuit board 14. The movement bed 19 has electromagnetic means 20 to quickly move the tool or hand within the plane 17 and has vertical motion means 21 within the robot to move the hand perpendicular to plane 17. Controls to regulate the translating and vertical motion of the tool or hand are contained within structure 23.

Figure 2:
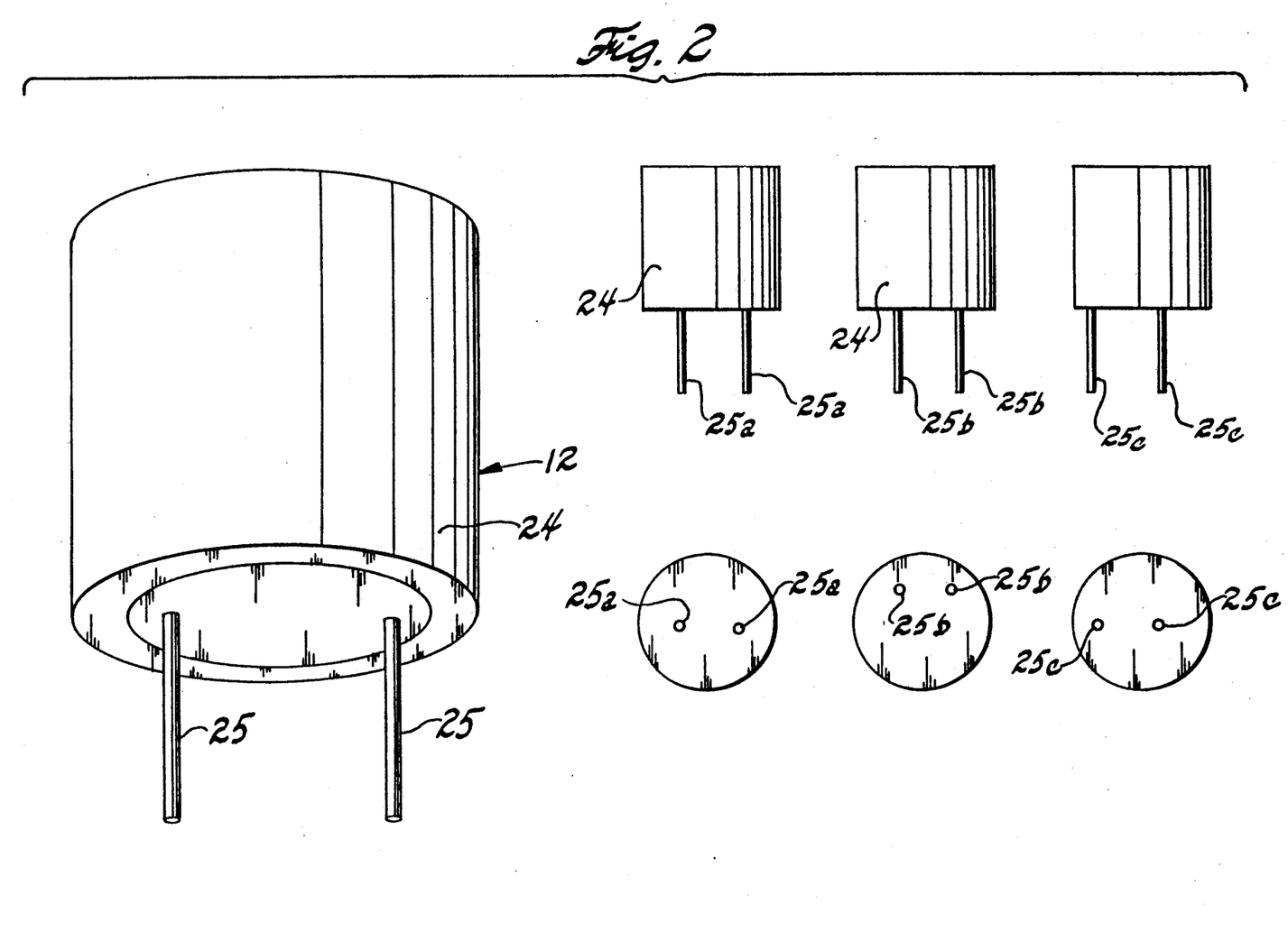
FIG. 2 is a composite view of electronic components to be transferred robotically, illustrating varying types of electrical lead misalignment that may be associated with its cast ceramic, molded, dipped or coated body.

Unfortunately, as shown in FIG. 2, the electronic circuit components 12 have bodies 24 (typically molded of plastic) which often are inconsistently arranged with respect to the leads 25 of such components. The variation between the pair of wire leads 25 (the portion that is precisely positioned in a source pallet) and the body 24 (the grippable portion) can be substantial, as shown in the three examples of leads in FIG. 2 (25a, 25b, 25c). For clearance reasons, the robotic gripper or hand 15 must pick up the leads by way of gripping the sides of the bodies 24. When the gripper fingers 26 close (move together) on a component or part, the shear forces may damage the leads 25 due to misalignment of the body 24. Distortions in component leads not only introduce potential electronic damage, but also result in failure to mesh with the target holes on circuit boards.

Figure 3:
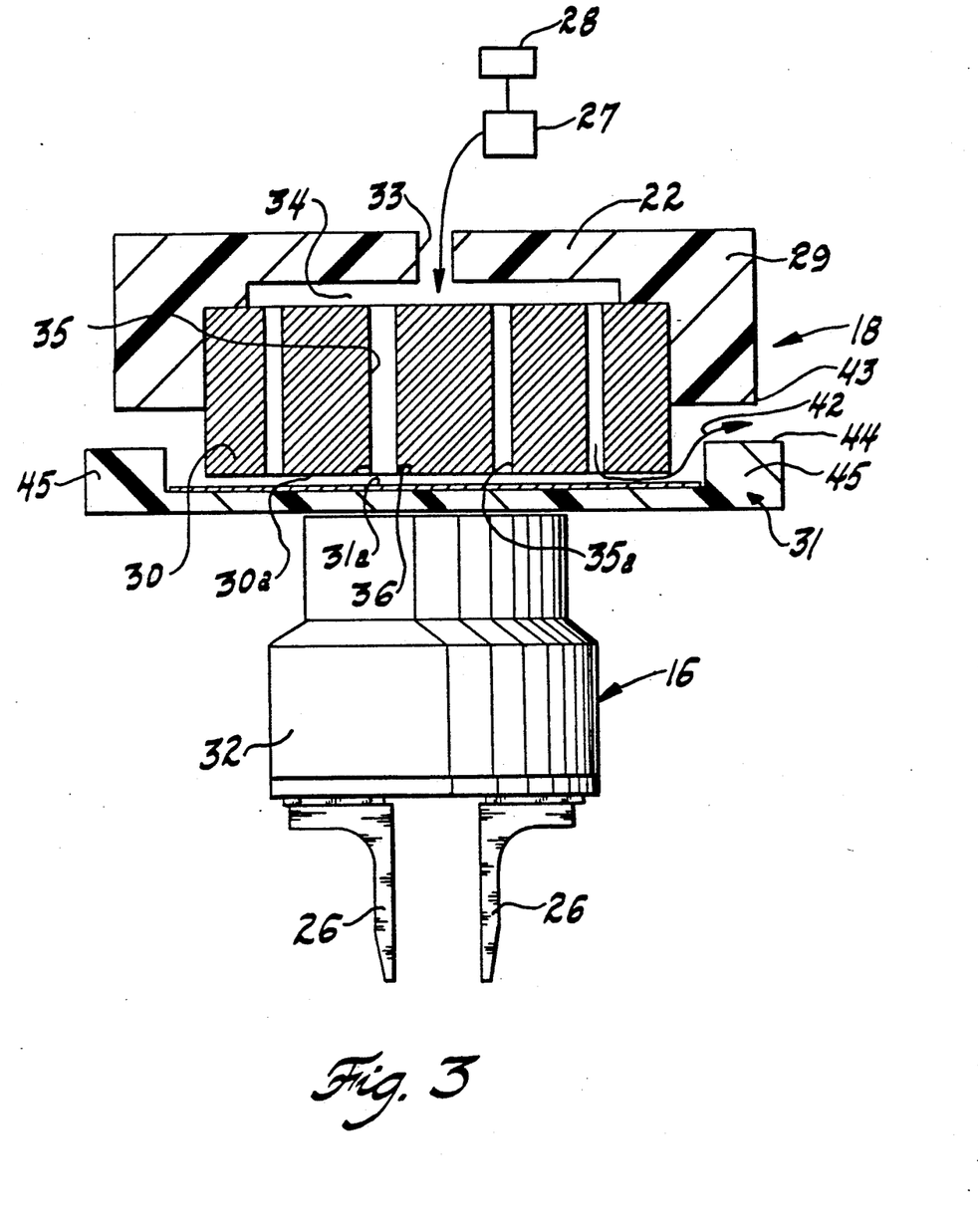
FIG. 3 is a schematic, partially sectional elevational view of a gripping hand supported by the compliant wrist.

The compliant wrist 18 of this invention, as shown in FIG. 3, allows the robotic apparatus 10 of FIG. 1 to comply to irregular shapes and provides a free-floating gripper system that will not damage component leads. The compliant wrist comprises: a magnet and supporting means 22 for supporting a positioning member 31 carrying a gripper tool 16, pneumatic means 27 for selectively separating and floating the positioning member 31 from the magnet and supporting means 22 thereby permitting lateral adjustment of the positioning member 31 in response to small forces received from the gripper tool 16 as it carries out gripping, and locking means 28 for locking the positioning member 31 to the magnet and supporting means 22 upon completion of the desired lateral adjustment.

The magnet and supporting means 22 is comprised of a nonmagnetic housing 29 (nonmagnetic means herein "nonmagnetically attractive" within the environment of this invention, such as stainless steel, brass and aluminum) within which is fixed one or more permanent magnets 30 having an exposed surface 30A to which is drawn the magnetizable positioning member 31 (in the form of a plate). The magnet must have a force to meet its intended function, preferably obtained by use of a rare earth magnet. This magnetic force varies with the size of the specific unit. The governing criteria are: (i) it should be much greater than the weight of the load in the gripper and the floating portion combined such as three or four times greater, (ii) the magnetic force minus the total floating weight when multiplied by a static friction coefficient must supply a frictional force such that when the floating unit is magnetically locked down it will not slide under a robot's maximum acceleration. The gripper tool has a housing 32 attached to the bottom surface of the positioning member 31 and contains actuating apparatus for moving gripper fingers 26 to and from each other within in a single plane.

Figure 4:
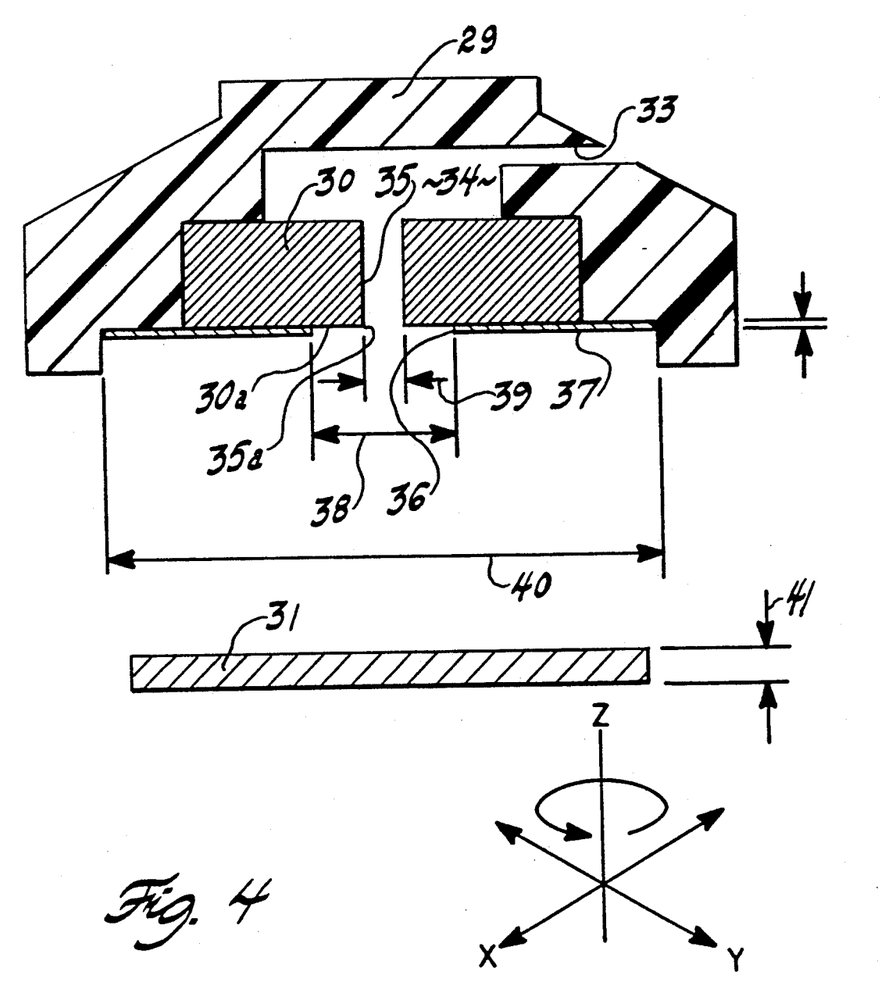
FIG. 4 is a view illustrating schematically the parameters of construction of the compliant wrist.

The pneumatic means 27 promotes lateral adjustment by floatation of member 31 in a magnetic field; it comprises an air intake 33 through the nonmagnetic housing 29, communicating with an intake plenum 34 which feeds one or more air passages 35 extending through the body housing of the permanent magnet(s) or as shown through the magnet. The air exiting from the passages feeds against the upper surface 31A of the positioning member, and, depending upon the force of the air pressure, will cause the positioning member to separate from surface 30A of the magnet. To facilitate such separation instantly, an exit plenum 36 may be defined about the passage exits 35A to assist initiation of such separation. As shown in FIG. 4, such plenum 36 may be defined by a nonmagnetic shim 37 in the form of a flat wafer attached to bottom surface 30A of the magnet. Such shim may be comprised of brass, aluminum, stainless steel, or even plastic material and have a thickness of about 0.01 inches. The exit plenum between the magnet and positioning member may have a lateral dimension 38 of about 0.3 in$^2$ and have a thickness of about 0.01 inch. The composite throat area of all the orifices 35 may have a cross-sectional area of about 0.012 in$^2$; the air pressure may be in the range of 20–90 psi. The profile for the exit air plenum 36 may be typically in the shape of a circle. The width of such exit plenum may be about 0.625 inches. The positioning member is desirably controlled with respect to two surface parameters: flatness of about 0.0001–0.0005 inches across the surface, and surface finish of about 16 microns (0.000016 inches) to be used on mating surfaces (magnetic and magnetically attracted surface). The positioning member preferably has a generally circular plan or profile configuration.

Thus, when the pneumatic means is activated to provide sufficient air pressure to force the positioning member away from surface 30A of the magnet, the positioning member will have freedom to translate in a linear path along the X-Y plane as shown in FIG. 4 as well as rotate about an axis perpendicular to such X-Y plane as well as twist or rotate about a z axis. The air film 42 generated between the magnet and the positioning member will spread out across the surface 31A of the positioning member and exit therefrom at the edges 43 of the permanent magnet housing and edges 44 of the positioning member. To prevent the positioning member from moving laterally an unwanted degree, the positioning member may be formed in the shape of a cup having lips 45 causing the exiting airflow to be diverted up and around when leaving the compliant wrist. The airflow between the magnet and positioning member may be designed for laminar flow which has the advantages of smooth, flutter-free movement of the positioning member, but the disadvantages of allowing the possibility of a tilting condition of the positioning member. Alternatively, the air film 42 therebetween may be allowed to be turbulent with the advantages of reducing the possibly tilting condition of the positioning member and less pneumatic flow required to maintain a constant separation between the positioning member and the stationary member, and disadvantages of potential flutter between stationary and positioning members. Laminar flow is preferred because it allows an even, steady lift-off without sudden or unpredictable shifts of airflow or pressure changes. To this end, multiple air orifices should be connected to only one input line or chamber to avoid instability due to lack of instantaneous pressure equalization.

The locking means 28 is a control for deactivation of the pneumatic separating means to allow the positioning member or plate to be held against or fixed to the position of the magnet.

Figure 5:
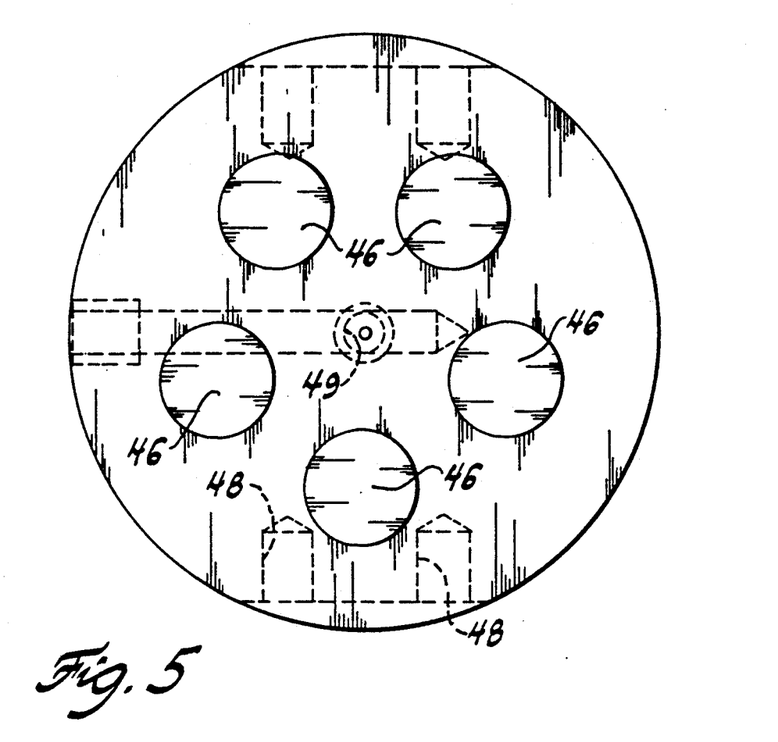
FIGS. 5 and 6 are plan and side views, respectively, of an alternative embodiment for the compliant wrists and magnets.
Figure 6:
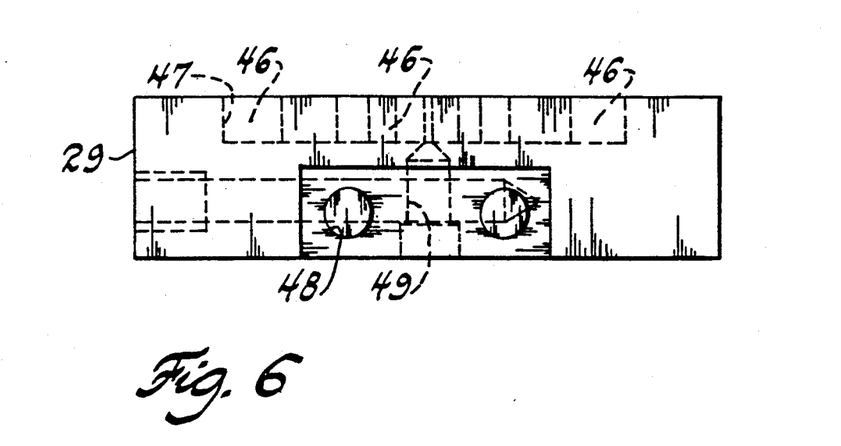

The magnet may be a unitary body or a multiple number of smaller permanent magnets 46 (shown five in number and equiangular spaced in FIGS. 5 and 6). The smaller magnets are cemented to complementary cavities 47 in the housing 29. Fastener receptacles 48 and 49 are also shown in FIG. 5 which are effective for attaching the magnet housing to the robot.

A recentering mechanism is desirable and necessary in many applications; such mechanism must accurately recenter the gripper with respect to the robot quill or access. Time delays make it undesirable to recenter on a fixed reference piece for every cycle. Advantageously, the recentering mechanism should recenter the float gripper assembly to within 0.01 inch translationally and 1° rotationally of a desired starting position. This should be accomplished within a time period of less than 0.1 second and do so by avoiding any permanent restoring force that may apply shear forces to the workpiece, such as the leads of an electronic component. This invention meets such criteria in the form of electromagnetic or mechanical means for selectively applying a force along the float plane to automatically return the positioning member to a predetermined starting position after gripping and transfer is completed. If such means is electromagnet, it may comprise attractive or repelling electromagnetic forces to achieve such purposes. If such means is alternatively mechanical, it may preferably deploy actuatable detents to realign such supporting member, with the detent having an actuatable axis either parallel or perpendicular to the float plane. In either case, mechanical contact or coupling between the positioning member and the stationary member is not permanently maintained through the use of springs or similar means or devices.

Figure 7:
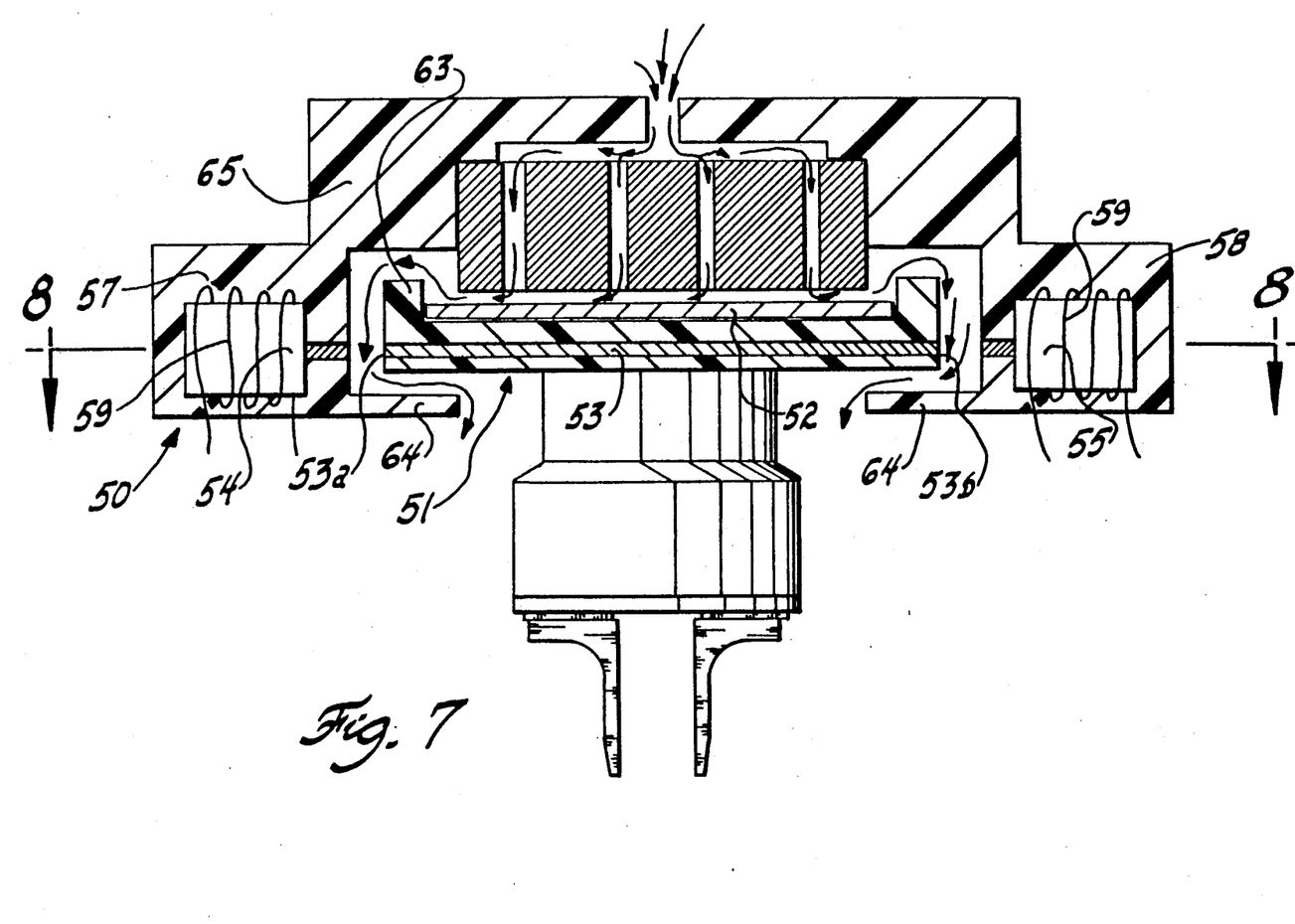
FIG. 7 is a view similar to FIG. 2 incorporating a first type of electromagnetic recentering device.
Figure 8:
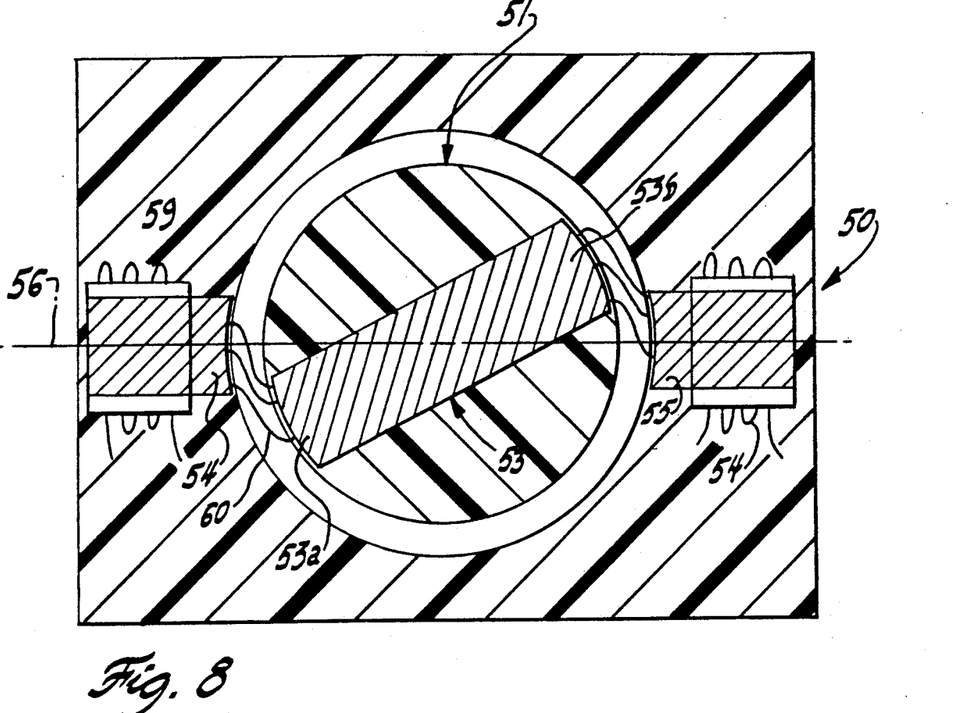
FIGS. 8 and 9 are sectional views taken along lines A—A of FIG. 7, each illustrating different operational modes of the recentering device.
Figure 9:
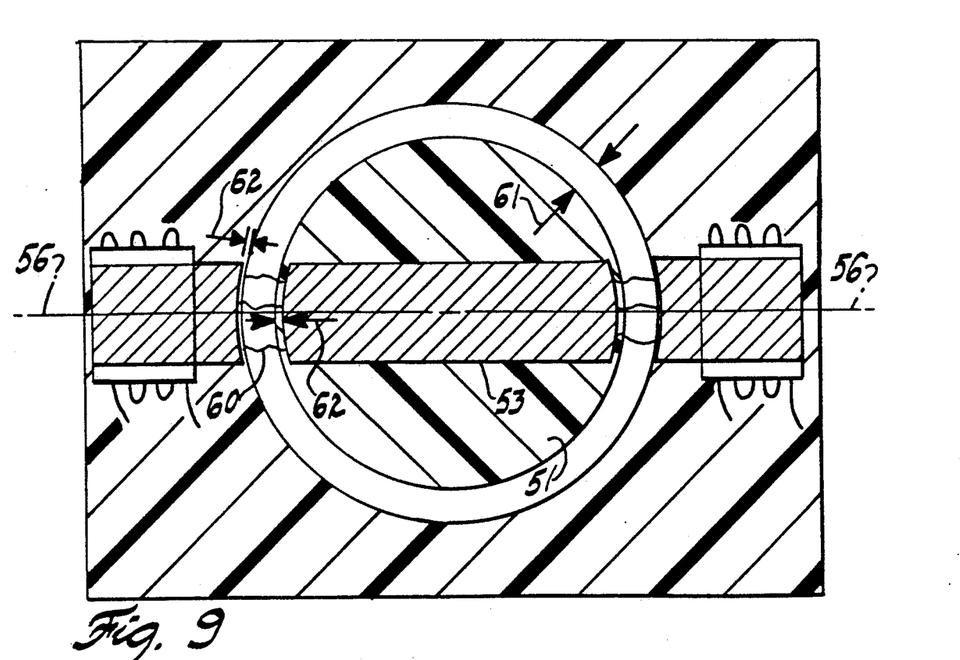

A first version of an electromagnetic recentering means 50 is shown in FIGS. 7-9. The positioning member is reconstituted to consist of a nonmagnetic cupped plate 51 having a magnetic plate 52 received within the upper cupped side to be magnetically attracted by the permanent magnet. A bar magnet 53 having north and south poles is embedded within the interior of the nonmagnetic plate 51, with its poles 53A and 53B exposed at the edges thereof. Electromagnets 54 and 55 are positioned along a predetermined centering plane 56 and are opposite in polarity to the bar magnet poles 53A and 53B to be attracted thereto. The electromagnets 54, 55 are supported within respective shoulders 57 and 58 extending integrally from the nonmagnetic housing 65. When the coils 59 of the electromagnets are energized, the north-south poles of the bar magnet 53 will be attracted (see flux lines 60) by the magnet cores of the electromagnets to rotate and shift the supporting member 51 to permit alignment and centering of the bar magnet 53 within the plane 56 as shown in FIG. 9. Oscillation induced by interaction between the electromagnets and the permanent magnet can be reduced by deploying air cores in the electromagnets which eliminate residual flux forces. The gap 61 between plate 51 and the arcuate surface of each electromagnet 54 or 55 is desirably within the range of 0.1-0.325 inches. The poles of the bar magnet may be recessed a distance 62 of 0.001-0.010 inches. Turbulant flow may be designed into the air bearing by providing upwardly extending annular lip 63 on the plate 51 and horizontally inwardly extending annular lip 64 on housing 65 protruding below the plate 51.

Figure 10:
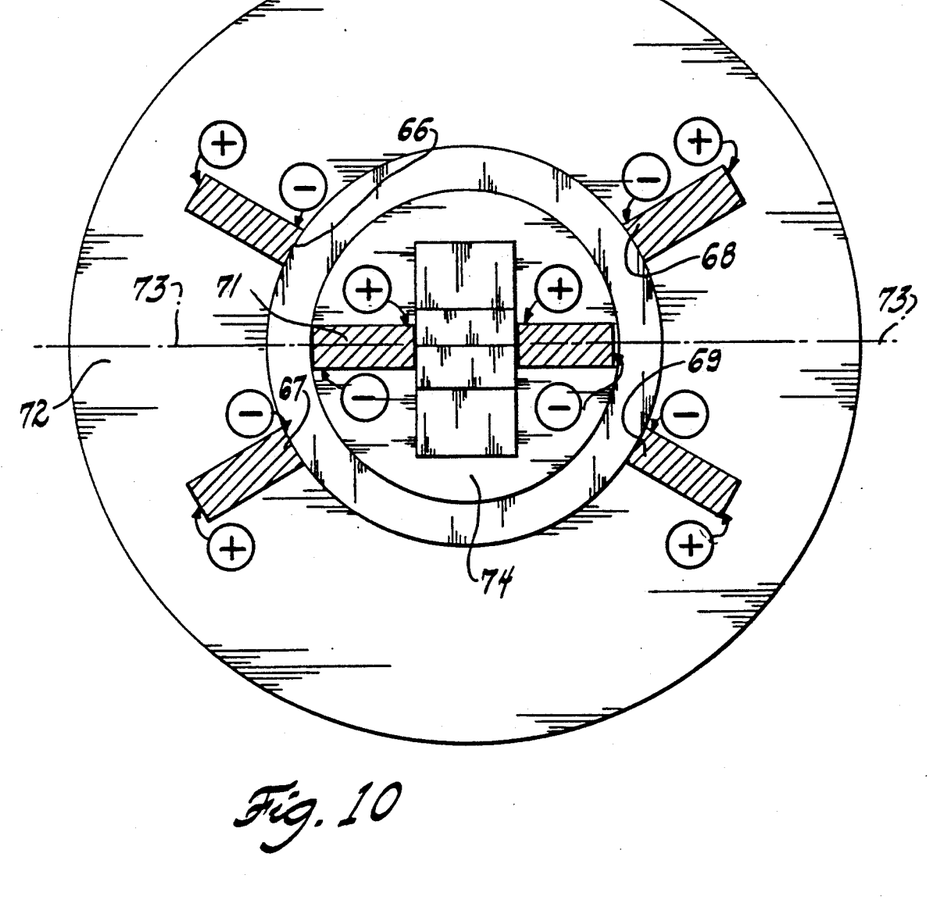
FIG. 10 is a diagramatic view of a second type of electromagnetic recentering device.

As shown in FIG. 10, electromagnetic repelling forces may be deployed for recentering. In this embodiment, all magnetic poles (66, 67, 68, 69, 70, and 71) are of the same polarity, i.e., positive. To promote recentering, four of such electromagnetic poles 66, 67, 68, and 69 are spaced apart, around opposite sides of the housing annular shoulder 72 in a manner so that each permanent magnet pole 70, 71 will lay between a pair of electromagnetic poles in normal operation. Thus, when the electromagnets are selectively energized after a transfer cycle is completed, the positioning member 74 will be automatically recentered and realigned along a plane 73 bisecting the location of the four electromagnets.

Figure 11:
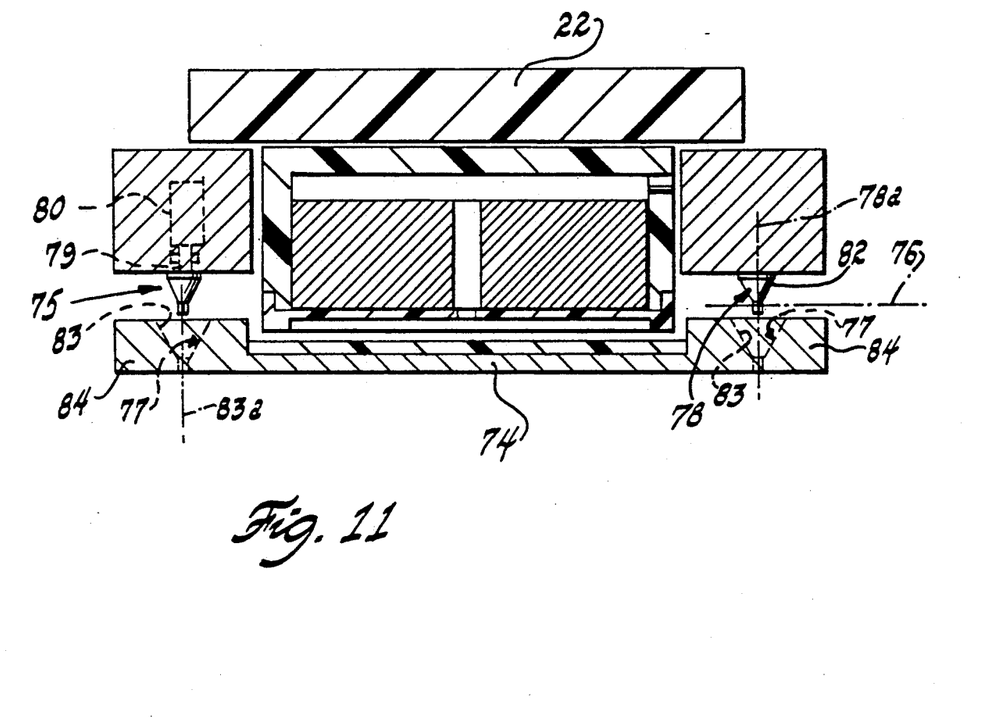
FIG. 11 is a schematic, partially sectional view of the compliant wrist showing a first type of mechanical recentering device incorporated therein.

As shown in FIG. 11, a mechanical recentering means 75 may be used having vertically actuated detents 77 with respect to the float plane 76. In this embodiment, a pair of centering pins 78 are each supported on subminiature pistons of piston 79 of air cylinders 80 located on opposite diametrical sides of the permanent magnet housing. The air cylinder support is fixed with respect to the permanent magnet housing. The air cylinders can, for example, exert a force of about 2.9 pounds at 60 psi pressure with a stroke of about ⅜ inch, utilizing a spring return. The pins have a conically shaped male collar 82 to effect recentering and locking when thrust into complementary female openings 83 disposed on extension 84 extending from opposite sides of the positioning member. To increase both translational and rotational compliance, the female openings 83 may be squared. Thus, upon actuation of the air cylinders, the centering pins 78 will thrust downwardly into the wide conical lead-in surfaces of openings 83; this brings coincidence of the pin and opening axes within a tolerance of 0.003-0.01 inches, causing the positioning member to become realigned and centered.

Figure 12:
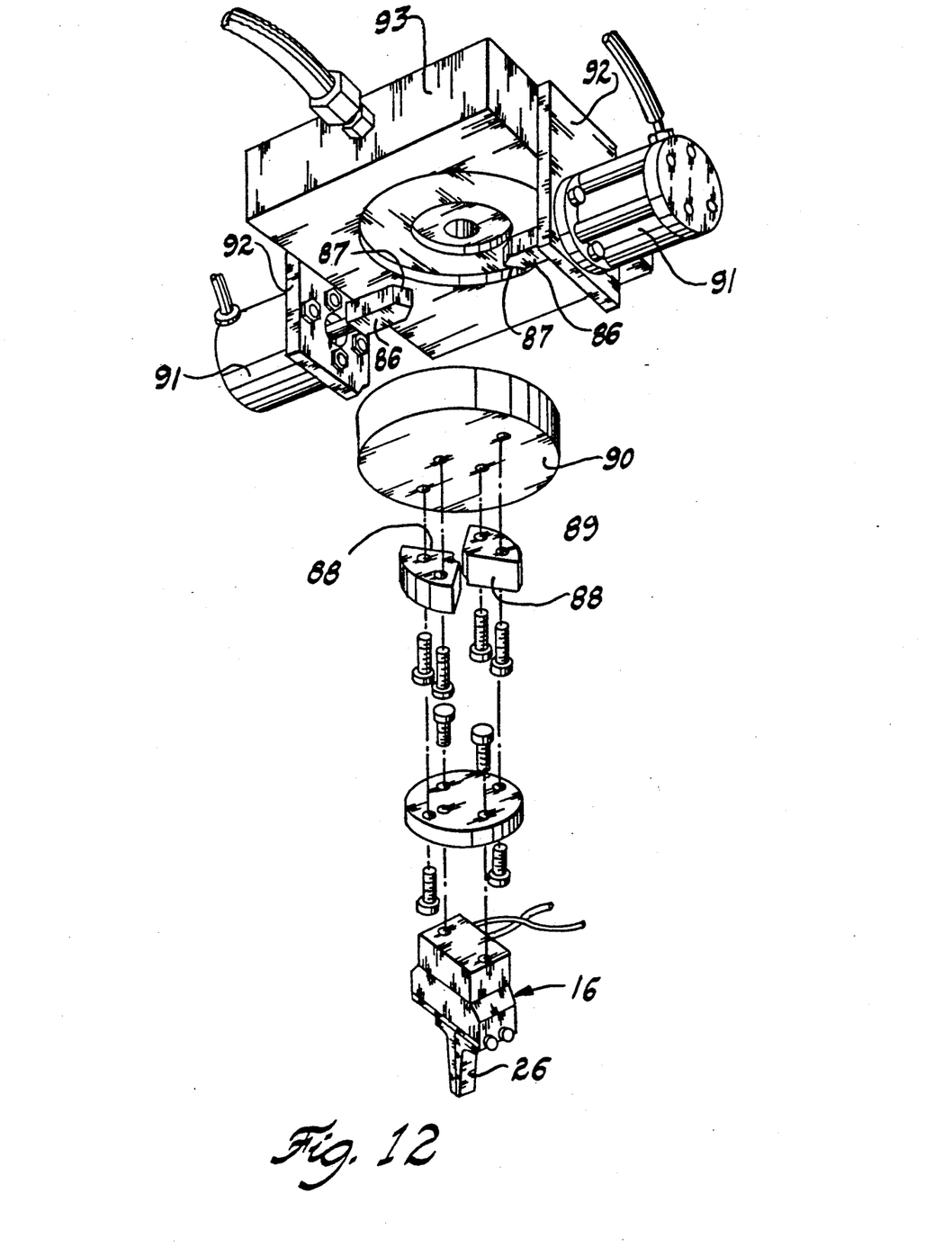
FIG. 12 is a schematic, partially sectional view of a second type of mechanical recentering device.

As shown in FIG. 12, another mechanical recentering means 85 may be used having horizontally actuated detents (parallel to the plane of floatation). Oppositely acting members 86 are actuated by air-driven piston cylinders 91 attached by plates 92 to the upper assembly fixed to the magnet housing 93 or robot. The pins 86 have wedge end faces 87 shaped to act as male surfaces for entering female wedge shaped openings 88 carried in a boss 89 depending from the positioning member 90. The members 86 serve to rotationally and translationally recenter the floating positioning member 90 when the members 86 enter the openings 88. Internal springs in the air cylinders retract the pistons; the air cylinders support the members once the cylinder air pressure is shut off.

The method of using such compliant wrist concept comprises: (a) magnetically suspending a positioning plate from a magnet, the plate carrying the gripper tool; (b) injecting a film of air between the interface of the magnet and plate to provide floating separation therebetween enabling ease of lateral movement; (c) closing a gripper tool about the part to be gripped causing any offcenter gripping forces to be translated back to the plate resulting in lateral movement in response thereto for seeking a centering position; and (d) upon achieving the desired centering position, deactivating the air injection to permit the magnet to lock the plate in position relative to the magnet for further robotic movement.

Figure 13:
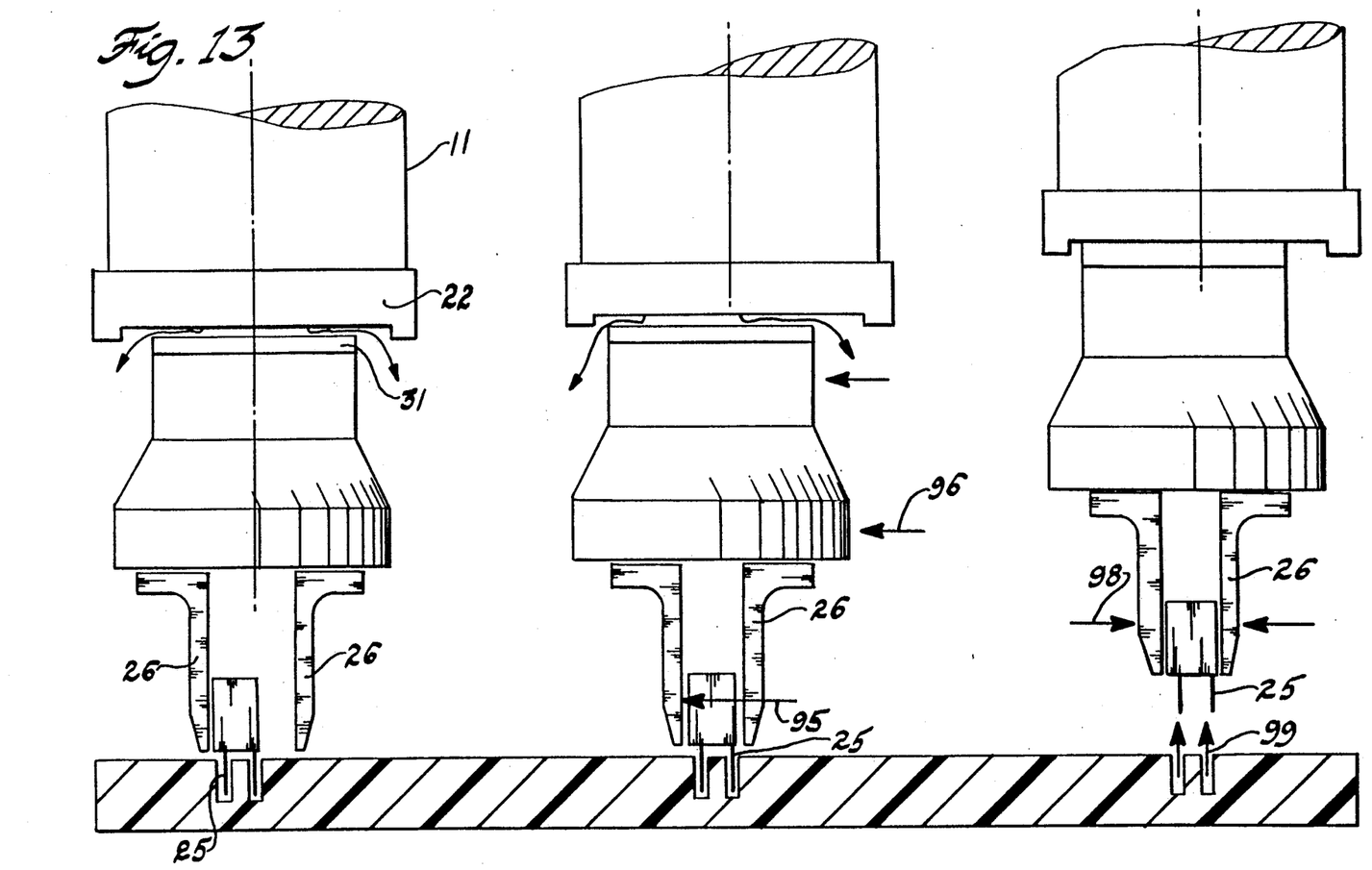
FIG. 13 is a schematic sequential elevational view of the structure of FIG. 2 shown in several operative stages.

Operation of the wrist is shown in FIG. 13. Initially, with the gripper fingers 26 open, as shown in the left portion of FIG. 13, the robot 11 (to which the upper part of the compliant wrist is rigidly fixed) moves into position above an electronic component part 12. When the robot is in position, activating the magnetic air bearing (22, 31) permits free compliance and the gripper fingers close on the part.

As shown in the center portion of FIG. 13, the action of the fingers closing on the part moves the floating assembly and the positioning member 31 to a correct position for picking up the part. The microforces 95 that are received from closing on the part 12 (misaligned from leads 25) are transmitted back to the positioning member to move it in a direction 96, in its free-floating condition, a distance which may be in the range of a few milligrams depending upon the dynamics of gripper closure. Essentially, the forces felt by the workpiece are due to only inertial loads presented by the accelerated motion of the floating portion of the device. Theoretically, if the gripper was closed infinitely slowly, the resulting forces on the part would be zero, viscous friction due to the air bearing would be zero, and the inertial load would not be accelerated so the sum of the forces would be zero.

Deactivating the bearing (air shutoff for magnetic lock-down) fixes the part 12 offset from the quill or centerline 97 of the robot, as shown in the right hand portion of FIG. 13. The part 12 is then lifted clear (along a direction 99) of its source pallet, while the fingers 26 apply a light gripping force 98 to the part, and moved into position for placement on the target circuit board. The frictional force between the two surfaces of the bearing (normal force provided by magnetic attraction and static friction) maintains the offset position. The leads 25 of the part are aligned with the robot quill 97, which locates the proper position on the circuit board and lowers the part into place. The robot will release the part 12 and move away to a neutral position, typically above the next part to be moved. With the bearing temporarily activated, the recentering mechanism may be used to align the floating assembly in the center of its limits of compliance (both translationally and rotationally).

The magnet and air bearing apparatus, according to the design above-described, will compensate for 0.125 inch of translational part misalignment (offset), compensate for ±10–15° of rotational part misalignment, and will maintain a locked position within .003 inches at a maximum speed of the robot, and will achieve liftoff at an air pressure of less than 60 pounds per square inch while minimizing pressure to maintain the bearing float.

The side loading of the fingers as they grip the electronic component encourage the floating member to adjust itself relative to the robot assuming there is an offset position, as shown in FIG. 13. To review the sequence, the recentering mechanism is turned off, the gripper fingers are closed, and the wrist automatically moves to relocate the new tool center point if the part is not in perfect position. Next, the air bearing is turned off and the locking mechanism is activated which rigidly holds the new position of the gripper. The permanent magnet automatically locks the wrist up when the air bearing is turned off. Additional locking mechanism may also be employed through other mechanical means. The robot automation picks up the part that is in its gripper fingers and transfers the part into its new location and is then released.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

What is claimed:

1. A compliant wrist for connecting a gripper tool to a robot, the gripper being carried on a positioning member, the wrist comprising:
    (a) means for magnetically supporting said positioning member which in turn supports said gripper tool;
    (b) pneumatic means for selectively separating and floating said positioning member from said magnetic supporting means to permit lateral and rotational adjustment of the positioning member in response to ultrasmall forces received from the gripper tool as it carries out gripping; and
    (c) means for locking the positioning member to the magnetic supporting means upon completion of the desired lateral adjustment.

2. The compliant wrist as in claim 1, in which said means (a) comprises a permanent magnet fixed to a nonmagnetic housing, the magnet having a magnetic force greater than the sum of (i) weight of the workpiece positioning member and gripper, and (ii) the force of said pneumatic means.

3. The compliant wrist as in claim 1, in which means (a) is a permanent magnet fixed and magnetically isolated with respect to said robot, said permanent magnet having a magnetic force effective to suspend the positioning member in a predetermined spaced relationship to the magnet when said pneumatic means is applied.

4. The complaint wrist as in claim 1, in which said pneumatic means comprises one or more passages extending through the magnet positioned to spread a uniformly thin airflow between the positioning member and magnetic means.

5. The complaint wrist as in claim 4, in which said pneumatic means is arranged to allow said airflow to exit at the edges of the plate and magnet.

6. The complaint wrist as in claim 1, in which said locking means comprises a control for deactivating said pneumatic separating means, allowing the positioning member to be fixed with the magnet for positioning.

7. The complaint wrist as in claim 6, in which a nonmagnetic shim is fixed to one of said positioning member or magnet means to facilitate lift-off of the positioning member when activated by said pneumatic means.

8. The complaint wrist as in claim 1, in which said positioning member is a plate having a surface magnetically responsive to the magnet means to be drawn thereto.

9. The compliant wrist as in claim 1, in which said pneumatic means comprises an annular lip on said supporting member to effectively cup the airflow passing between the magnet and supporting member and prevent the supporting member from laterally shifting away from said magnet beyond the extremity of said lips.

10. The compliant wrist as in claim 4, in which the pneumatic means comprises a composite throat area of said passages with an area of about 0.012 inches, and the air pressure being fed to said pneumatic means being in the range of 20-90 psi.

11. The compliant wrist as in claim 4, in which said pneumatic means defines a plenum chamber at the exit of the passages from said magnet means to facilitate lift-off of the positioning member from the magnet means.

12. The complaint wrist as in claim 1, in which the airflow between the magnet and positioning member during separation is about 0.001-0.004 inches in thickness.

13. A method of using a compliant wrist connecting a gripper tool to a robot, comprising:
 (a) magnetically suspending a positioning plate from a magnet, the plate carrying the gripper tool;
 (b) injecting a film of air between the interface of the magnet and plate to provide floating separation therebetween enabling ease of lateral movement;
 (c) closing said gripper tool about the part to be gripped causing any offcenter gripping forces to be translated back to the plate resulting in lateral movement in response thereto for seeking a centering position; and
 (d) upon achieving the desired centering position, deactivating the air injection to permit the magnet to lock the plate in position relative to the magnet for further robotic movement.

14. The method as in claim 13, in which said plate is recentered to a predetermined position between steps (b) and (c).

15. The method as in claim 13, in which said centering means is comprised of an electromagnetic means employing attractive or repelling electromagnetic forces to achieve such recentering.

16. The method as in claim 16, in which said recentering means is mechanical and deploys actuatable detents to realign the plate, the detents having an actuatable axis either parallel or perpendicular to the float plane.

17. The method as in claim 13, in which said steps are carried out within the cycle time of one second or less.

18. The method as in claim 14, in which said recentering step is carried out within a period of less than one second.

19. The method as in claim 14, in which step (b) is carried out within a period of less than 0.75 seconds.

20. The method as in claim 14, in which said method is effective to accurately transfer a part within an accuracy of plus or minus 0.125 inches of translation, and plus or minus 10°-15° of rotation.

21. A robotic apparatus for positioning an attached tool to perform an operation on a workpiece, comprising:
 (a) means to support said tool upon a linear translating arm, said support having transverse motion means to move in a first X-Y plane and vertical motion means to move in a direction perpendicular to said first plane; and
 (b) compliant float wrist for connecting the gripper tool to the support means to permit compliance between the workpiece having one portion thereof out of compliance within a range of plus or minus 0.125 inches in a translatory direction and plus or minus 10° in a rotational direction from another portion of the workpiece which is prepositioned within a holding die, said compliant wrist having means for magnetically supporting a positioning member carrying the gripper tool, and pneumatic means for selectively separating and floating the positioning member from the supporting means to permit lateral adjustment of the positioning member in response to substantially small forces received from the gripper tool as it carries out gripping.

* * * * *